(12) United States Patent
Weber et al.

(10) Patent No.: US 10,209,286 B2
(45) Date of Patent: Feb. 19, 2019

(54) RESISTANCE MEASUREMENT TOOL

(71) Applicant: Ford Global Technologies, LLC, Dearborn, MI (US)

(72) Inventors: David Charles Weber, Toledo, OH (US); Mark Milton Mahoney, Hartland, MI (US); Jonathan Strachan, Ypsilanti, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 120 days.

(21) Appl. No.: 15/043,787

(22) Filed: Feb. 15, 2016

(65) Prior Publication Data
US 2017/0234917 A1    Aug. 17, 2017

(51) Int. Cl.
*G01R 27/02* (2006.01)
*G01R 31/00* (2006.01)
*G01R 27/14* (2006.01)
*G01R 31/02* (2006.01)

(52) U.S. Cl.
CPC ........... *G01R 31/006* (2013.01); *G01R 27/02* (2013.01); *G01R 27/14* (2013.01); *G01R 31/021* (2013.01)

(58) Field of Classification Search
CPC ...... G01R 27/02; G01R 27/14; G01R 31/025; G01R 31/40; G01R 21/133; G01R 21/06; G01R 27/025; G01R 19/0092
USPC ....... 324/549, 691, 99 D, 103 R, 103 P, 122, 324/522, 399, 402, 519, 525, 532, 628
See application file for complete search history.

(56) References Cited

U.S. PATENT DOCUMENTS

| | | | | |
|---|---|---|---|---|
| 2,292,187 A | * | 8/1942 | Willmann | H01H 73/30 337/59 |
| 2,292,189 A | * | 8/1942 | Witzel | F01L 13/00 123/179.3 |
| 2,776,406 A | * | 1/1957 | Cohn | G01R 21/00 324/103 R |
| 3,274,489 A | * | 9/1966 | Behr | G01R 31/08 324/509 |
| 3,626,222 A | * | 12/1971 | Dischler | B30B 1/181 100/289 |

(Continued)

FOREIGN PATENT DOCUMENTS

| | | |
|---|---|---|
| CN | 2104452 | 5/1992 |
| CN | 203455408 | 2/2014 |

(Continued)

OTHER PUBLICATIONS

Search Report dated Apr. 21, 2017 for GB Patent Application No. GB1702409.2 (3 pages).

*Primary Examiner* — Jermele M Hollington
*Assistant Examiner* — Taqi Nasir
(74) *Attorney, Agent, or Firm* — James P. Muraff; Neal, Gerber & Eisenberg LLP

(57) ABSTRACT

A tool to measure resistance of a wire harness is disclosed herein. An example disclosed tool includes a connector with first and second plugs. The example disclosed tool also includes a resistor. A first terminal of the resistor is electrically coupled to the first plug. Additionally, the example disclosed tool includes a thermal switch attached to the resistor with a thermally conductive adhesive. A first terminal of the thermal switch is electrically coupled to a second terminal of the resistor, and a second terminal of the thermal switch is electrically coupled to the second plug.

22 Claims, 4 Drawing Sheets

(56) References Cited

U.S. PATENT DOCUMENTS

| | | | | |
|---|---|---|---|---|
| 3,800,214 A * | 3/1974 | O'Flynn | ............... | G01R 31/021 |
| | | | | 324/508 |
| 3,900,783 A * | 8/1975 | Herzog | ................ | H02J 7/0091 |
| | | | | 307/66 |
| 4,831,321 A * | 5/1989 | Cooper | ................ | H02J 7/0034 |
| | | | | 320/105 |
| 5,600,255 A | 2/1997 | Moore et al. | | |
| 5,689,966 A * | 11/1997 | Zess | ........................ | F25B 40/04 |
| | | | | 62/238.6 |
| 5,698,966 A * | 12/1997 | Chen | ..................... | H01M 10/46 |
| | | | | 320/154 |
| 6,707,372 B2 * | 3/2004 | Davis | ................. | G08B 13/1681 |
| | | | | 337/300 |
| 6,707,375 B2 * | 3/2004 | Masudaya | ........... | G07C 9/00309 |
| | | | | 307/10.1 |
| 7,079,040 B2 * | 7/2006 | Barton | ..................... | F24F 11/30 |
| | | | | 340/657 |
| 7,358,740 B2 * | 4/2008 | Davis | ..................... | H01H 37/54 |
| | | | | 324/417 |
| 8,400,252 B2 | 3/2013 | Jung et al. | | |
| 8,654,497 B2 | 2/2014 | El Filali et al. | | |
| 2009/0295335 A1 * | 12/2009 | Yang | ................... | H01M 10/441 |
| | | | | 320/134 |
| 2010/0302051 A1 * | 12/2010 | Hermann | ............ | H01M 10/486 |
| | | | | 340/636.11 |

FOREIGN PATENT DOCUMENTS

| | | |
|---|---|---|
| CN | 204479699 U | 7/2015 |
| EP | 1321751 A1 | 6/2003 |
| WO | WO 2013130048 A1 | 9/2013 |

\* cited by examiner

RESISTANCE MEASUREMENT TOOL

TECHNICAL FIELD

The present disclosure generally relates to measuring impedance of wire harnesses using a resistance measurement tool.

BACKGROUND

Electronic control units (ECUs) monitor and control the low-level systems of a vehicle. For example, the ECUs may control and/or monitor the lighting system, the engine, the power locks, the power windows, the power train, the HVAC system, and the battery management, etc. ECUs may have sensors (such as a knock sensor) that are connected to the ECU by a wire harness. Wires in the wire harness have impedance values (measured in ohms ($\Omega$) and/or milliohms (m$\Omega$)). Some sensors and/or ECUs are sensitive to drops in voltage. For example, an ECU that normally operates at an input voltage of 14 volts (V) may not operate properly if the input voltage is 13V or less. Additionally, some sensors/ECUs draw 3 to 10 amps (A) of current from the battery. According to Ohm's Law (voltage=current×resistance), if the ECU has a 1V tolerance and draws 10 A, the wire harness can have a maximum resistance of 100 m$\Omega$. Additionally, in some vehicles that include a start-stop system, the vehicle system voltage may occasionally drop. In such cases, the maximum resistance of the wire harness determined to be even lower to take into account the occasional voltage drops.

Digital multimeters and ohmmeters measure resistance. However, the resolution and/or accuracy of typical commercial meters cannot make accurate milliohm measurements. For example, if a meter has a range of 600$\Omega$, a resolution of 0.1$\Omega$, and an accuracy of 0.5%+0.2$\Omega$, the potential error of the meter is up to ±3.2$\Omega$ (600$\Omega$*0.005+0.2$\Omega$). In such an example, if the meter indicated the resistance of the wire harness was 200 m$\Omega$, the actual resistance could be from 0 m$\Omega$ to 401 m$\Omega$. Such a meter cannot measure resistance of the wire harness with enough accuracy.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

An example tool for measuring the resistance of a wire harness includes a connector with first and second plugs. The example tool also includes a resistor. A first terminal of the resistor is electrically coupled to the first plug. Additionally, the example tool includes a thermal switch attached to the resistor with a thermally conductive adhesive. A first terminal of the thermal switch is electrically coupled to a second terminal of the resistor, and a second terminal of the thermal switch is electrically coupled to the second plug.

Another example tool for measuring the resistance of a wire harness includes a connector with first and second plugs. The example tool also includes a resistor. A first terminal of the resistor is electrically coupled to the first plug. The example tool also includes a first switch. A first terminal of the first switch is electrically coupled to a second terminal of the resistor. Additionally, the example tool includes a second switch attached to the resistor with a thermally conductive adhesive. A first terminal of the second switch is electrically coupled to a second terminal of the first switch, and a second terminal of the thermal switch is electrically coupled to the second plug.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
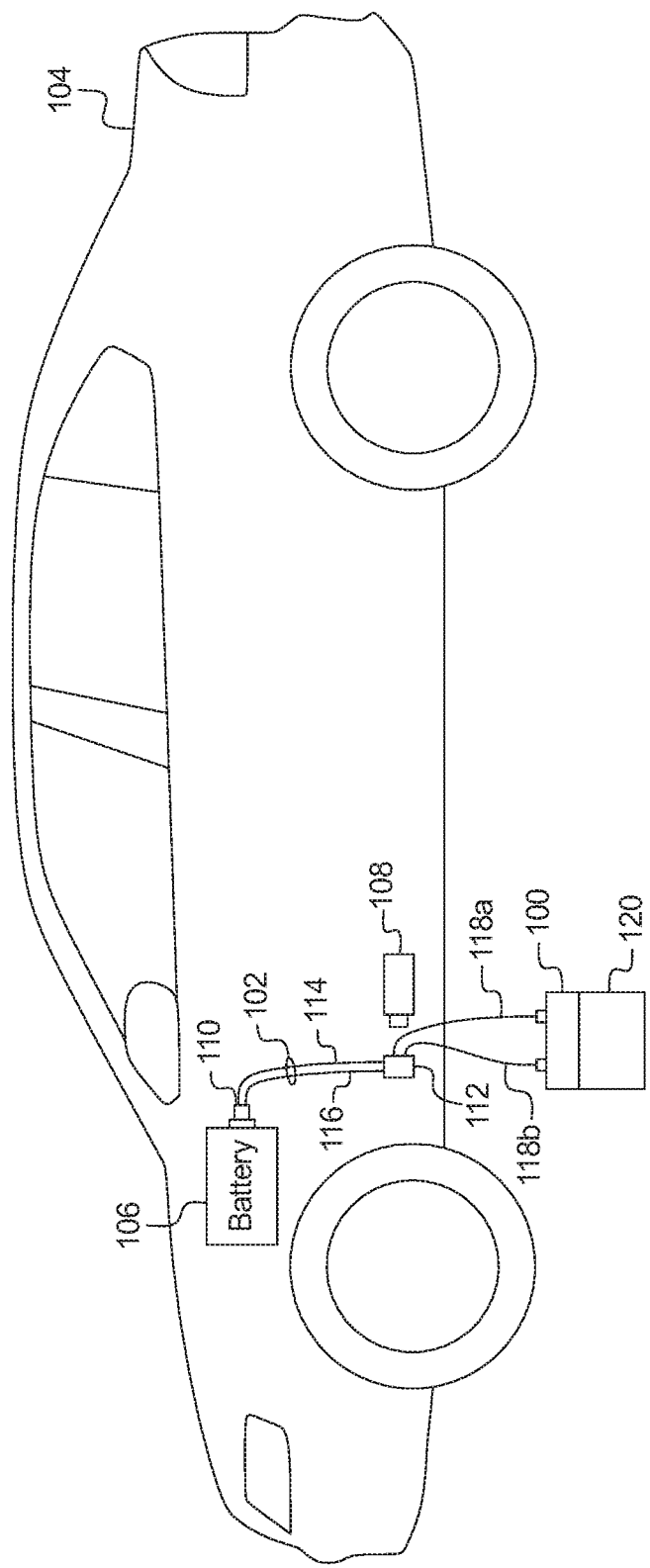
FIG. 1 illustrates a resistance measuring tool measuring a wire harness of a vehicle in accordance with the teachings of this disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated. For example, the invention may be used when measuring the impedance of any conductive circuit.

FIG. 1 illustrates a resistance measurement tool 100 measuring a wire harness 102 of a vehicle 104 in accordance with the teachings of this disclosure. The vehicle 104 is any type of road vehicle (e.g., cars, trucks, motorcycles, mopeds, etc.). The vehicle 104 may be a standard gasoline powered vehicle, a hybrid vehicle, an electric vehicle, a fuel cell vehicle, or any other type of suitable vehicle. The vehicle 104 includes a battery 106 that supplies power to vehicle components 108, such as sensors, actuators, and/or electronic control units (ECUs). The vehicle 104 also includes standard features (not shown) such as a dashboard, adjustable seats, one or more batteries, an HVAC system including a compressor and electronic expansion valve, a windshield, doors, windows, seatbelts, airbags, and tires.

The wire harness 102 includes a first connector 110 that connects the wire harness 102 to the vehicle component 108. In some examples, the first connector 110 is a male connector (that is, the pins of the connector are exposed). The wire harness 102 also includes a second connector 112 that connects the wire harness to (a) the battery 106 or (b) a power bus that is connected to the battery 106. In some examples, the wire harness also includes a third connector (not shown) that electrically couples the vehicle component 108 to a data bus (such as a controller area network (CAN) bus). Between the first connector 110 and the second connector 112, the wire harness 102 includes a power wire 114 and a ground wire 116. In some examples, the power wire 114 and the ground wire 116 may be 10, 12, 16, 18, 20, 22, or 24 gauge insulated copper wire depending on the current that will be flowing through the wire and the wire length. For example, if 10 A will be flowing through the wires, the power wire 114 and the ground wire 116 may be 18 or 20 gauge wires. In some examples, a ground terminal (not shown) of the battery 106 and the ground wire 116 are electrically coupled to the frame of the vehicle 104

When measuring the resistance of the wire harness 102, the resistance measurement tool 100 is electrically coupled to the power wire 114 and the ground wire 116 of the wire harness 102. In the illustrated example, the resistance measurement tool 100 is electrically coupled to the power wire 114 and the ground wire 116 via flex probes 118a and 118b. The flex probes 118a and 118b of the illustrated example have a first end with a socket that fits one of the pins of the second connector 112. In some examples, the first end is interchangeable to facilitate the flex probes 118a and 118b connecting to different wire harnesses 102 with different pin configurations, genders, and/or sizes. Insulated copper wires connect the first end of the flex probes 118a and 118b to a second end that plugs into a meter 120 and/or the resistance measurement tool 100. In some examples, because meters 120 typically have banana jacks, the second end of the flex probes 118a and 118b include a banana plug. The banana plug may have a jack to facilitate another banana plug.

The meter 120 may be any suitable device to measure voltage, such as an voltmeter or a digital multimeter. In some examples, the meter 120 is a handheld meter, such as a Model 77 Series IV Digital Multimeter manufactured by Fluke®. Alternatively, the meter 120 may be an oscilloscope and/or a data capture device connected to a computing device (such as a computer, a laptop, a tablet, a smartphone, etc.). The meter 120 has an accuracy rating and a resolution rating over the expected an expected voltage measurement range (such as 5V to 20V, etc.). For example, the meter 120 may have a resolution rating of 0.01V and accuracy of 0.3%±0.01V. For such an example, the meter 120 measures the voltage to be 13.85V, the actual value is between 13.80V to 13.90V (13.85±((13.85*0.003)+0.01)).

In some examples, the flex probes 118a and 118b plug into the meter 120, and the resistance measurement tool 100 plugs into the flex probes 118a and 118b. Alternatively, in some examples, when the resistance measurement tool 100 can be selectively activated, the resistance measurement tool 100 plugs into the meter 120, and the flex probes 118a and 118b plug into the resistance measurement tool 100. As discussed below, the resistance measurement tool 100 facilitates determining the resistance value of the wire harness 102.

Figure 2A:
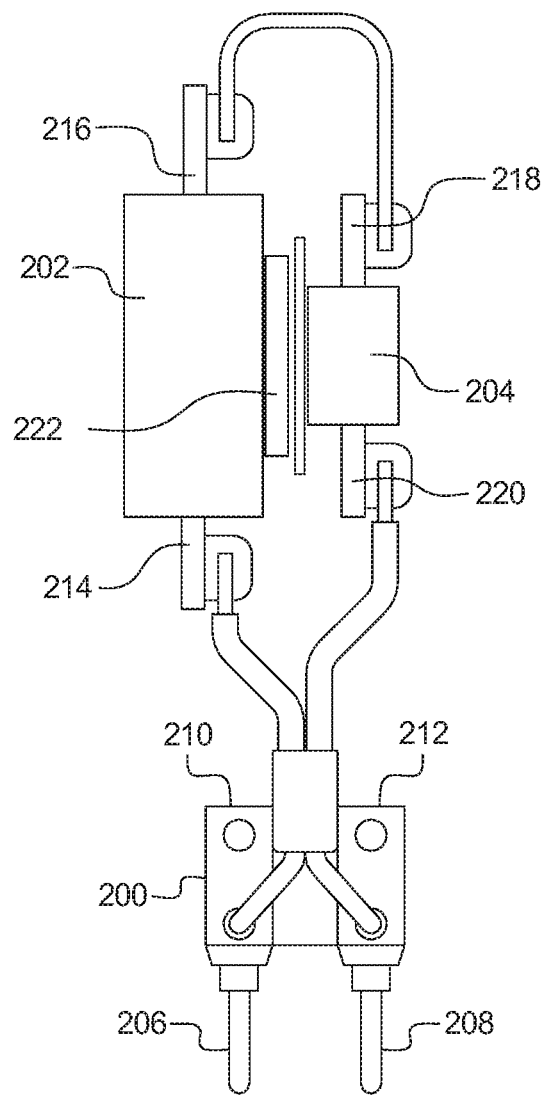
FIGS. 2A and 2B illustrate an example resistance measurement tool.
Figure 2B:
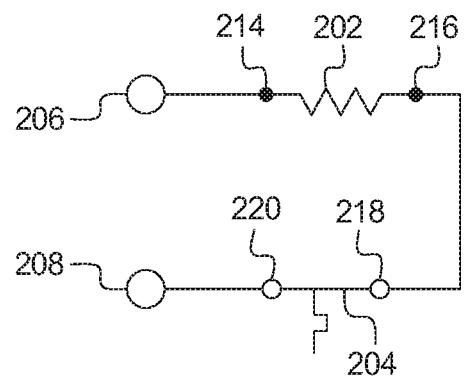

FIGS. 2A and 2B illustrate the example resistance measurement tool 100 of FIG. 1. FIG. 2A depicts the example resistance measurement tool 100. FIG. 2B is a schematic of the example resistance measurement tool 100. The resistance measurement tool 100 includes a connector 200, a resistor 202, and a thermal switch 204.

The connector 200 has a first plug 206 and a second plug 208. The plugs 206 and 208 are spaced to plug into a ground jack and a direct-current (DC) voltage measurement jack of the meter 120 of FIG. 1. The plugs 206 and 208 have corresponding electrically coupled jacks 210 and 212 to receive the plugs of the flex probes 118a and 118b. In some examples, the connector 200 is a dual-pin banana plug. Alternatively, the connector 200 may be any suitable connector to interface with the meter 120.

The resistor 202 is a power resistor with a first terminal 214 and a second terminal 216. The resistor 202 has an impedance value. The impedance value affects the sensitivity of the resistance measurement tool 100. The higher the impedance value of the resistor 202, the lower the sensitivity of the resistance measurement tool 100. In some examples, the impedance of the resistor 202 is selected so that the current flowing through the resistor 202 when the resistance measurement tool 100 is in operation approximates the current conducted by the wire harness 102 being measured. For example, if the current conducted by the wire harness 102 is 7 A and the voltage on the power bus is 14V, the impedance of the resistor 202 may be 2Ω. For example, the impedance value may be 5Ω. Additionally, in some examples, a current rating of a fuse electrically coupled to the power bus and the time available to measure the impedance of the wire harness 102 also influences the impedance value of the resistor 202. For examples, the higher the impedance value of the resistor 202, the fast the resistor will increase in temperature generated when measuring the impedance value of the wire harness 102.

The resistor 202 has a tolerance value. The tolerance value indicates the variability of the impedance value of the resistor 202 due to, for example, the manufacturing process or aging. For example, a 5Ω resistor with a tolerance value of 1% would have an actual value between 4.95Ω and 5.05Ω. Power dissipated by the resistor 202 causes the resistor to heat. The resistor 202 has a temperature coefficient of resistance (TCR) value that indicates the range of variability in the impedance of the resistor 202 as the temperature of the resistor 202 increases. For example, a 5Ω with a TCR value of ±50 parts per million per degree Celcius (ppm/° C.) heated to 63 degrees Celsius (145 degrees Fahrenheit) would have an actual impedance between 4.99Ω and 5.01Ω. The tolerance value and the TCR value of the resistor 202 affect the accuracy of the resistance measurement tool 100.

The thermal switch 204 is a normally-closed switch that opens when the temperature on a temperature sensitive disc exceeds a threshold trigger temperature. The thermal switch 204 has a first terminal 218 and a second terminal 220. The thermal switch 204 resets when the temperature sensitive disc falls below a threshold reset temperature. For example, the threshold trigger temperature may be 63 degrees Celsius (145 degrees Fahrenheit) and the threshold reset temperature may be 46 degrees Celsius (115 degrees Fahrenheit). The thermal switch 204 prevents the resistor 202 from overheating. In the illustrated example, the temperature sensitive disc of the thermal switch 204 is attached to a surface of the resistor 202 via thermally conductive adhesive 222. In some examples, the thermally conductive adhesive 222 is (a) an epoxy preform sized to fit the temperature sensitive disc of the thermal switch 204, (b) an injected adhesive, and/or (c) double-sided tape, etc. Alternatively, in some examples, the thermal switch 204 is attached to a surface of the resistor 202 via a mechanical fastener (not shown).

The first plug 206 of the connector 200 is electrically coupled to the first terminal 214 of the resistor 202. The second terminal 216 of the resistor 202 is electrically coupled to the first terminal 218 of the thermal switch 204. The second terminal 220 of the thermal switch 204 is electrically coupled to the second plug 208 of the connector 200. In the illustrated example, insulated copper wire eclectically couples the connector 200, the resistor 202, and the thermal switch 204. The wire is soldered or crimped to the terminals 214, 216, 218 and 220 and to the plugs 206 and 208. The gauge of the wire is selected based on the current expected to flow through the resistance measurement tool 100. For example, if the expected current is 3 A, the wire may be 18-gauge. In some examples, the gauge of wire may be increased to lower any impedance introduce to the resistance measurement tool 100 by the wire. Alternatively, in some examples, the connector 200, the resistor 202 and/or the thermal switch 204 are mounted on a printed circuit board and are electrically coupled by copper traces and/or wires.

Figure 3A:
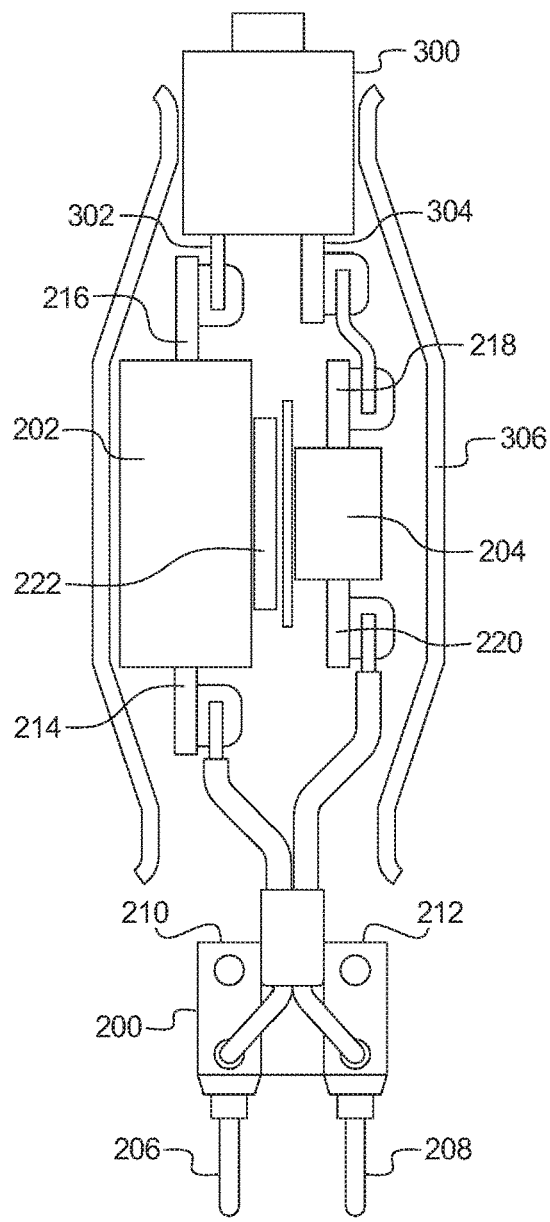
FIGS. 3A and 3B illustrate another example resistance measurement tool.
Figure 3B:
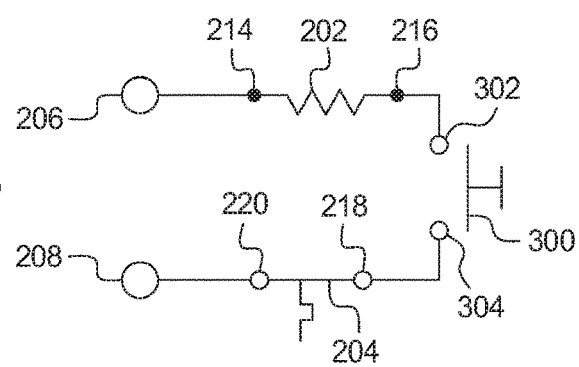

FIGS. 3A and 3B illustrate another example of the resistance measurement tool 100 of FIG. 1. FIG. 3A depicts the example resistance measurement tool 100. FIG. 3B is a schematic of the example resistance measurement tool 100. The resistance measurement tool 100 includes the connector 200, the resistor 202, the thermal switch 204, and a push-button switch 300. In the illustrated example, the push-button switch 300 is a normally-open switch that closes when pressed and reopens when not pressed. Alternatively, in some examples, the push-button switch 300 is a switch that closes when pressed and reopens when pressed again. The push-button switch 300 has a first terminal 302 and a second terminal 304. The push-button switch 300 facilitates an operator selectively activating the resistance measurement tool 100. In some examples, the resistor 202 and the thermal switch 204 of FIGS. 2A and 3A are enclosed by a casing 306. In some such examples, the casing 306 is a nylon, Teflon®, or polyolefin heat shrink tube that protects the resistor 202, the thermal switch 204, and the solder joints from the environment.

The first plug 206 of the connector 200 is electrically coupled to the first terminal 214 of the resistor 202. The second terminal 216 of the resistor 202 is electrically coupled to the first terminal 302 of the push-button switch 300. The second terminal 304 of the push-button switch 300 is electrically coupled to the first terminal 218 of the thermal switch 204. The second terminal 220 of the thermal switch 204 is electrically coupled to the second plug 208 of the connector 200. In the illustrated example, insulated copper wire electrically couples the connector 200, the resistor 202, and the thermal switch 204. The wire is soldered to the terminals 214, 216, 218 and 220 and to the plugs 206 and 208. The gauge of the wire is selected based on the current expected to flow through the resistance measurement tool 100. For example, if the expected current is 3 A, the wire may be 18-gauge. In some examples, the second terminal 304 of the push-button switch 300 is directly coupled to the first terminal 218 of the thermal switch 204. Alternatively, in some examples, the connector 200, the resistor 202 and/or the thermal switch 204 are mounted on a printed circuit board and are electrically coupled by copper traces and/or wires.

In the illustrated example, the push-button switch 300 is electrically coupled between the resistor 202 and the thermal switch 204. In some examples, the push-button switch 300 may be electrically coupled between other components, such as between the connector 200 and the resistor 202 or between the thermal switch 204 and the connector 200. In some examples, the resistance measurement tool 100 does not include the thermal switch 204, and the second terminal 304 of the push-button switch 300 is electrically coupled to the second plug 208 of the connector 200.

Figure 4:
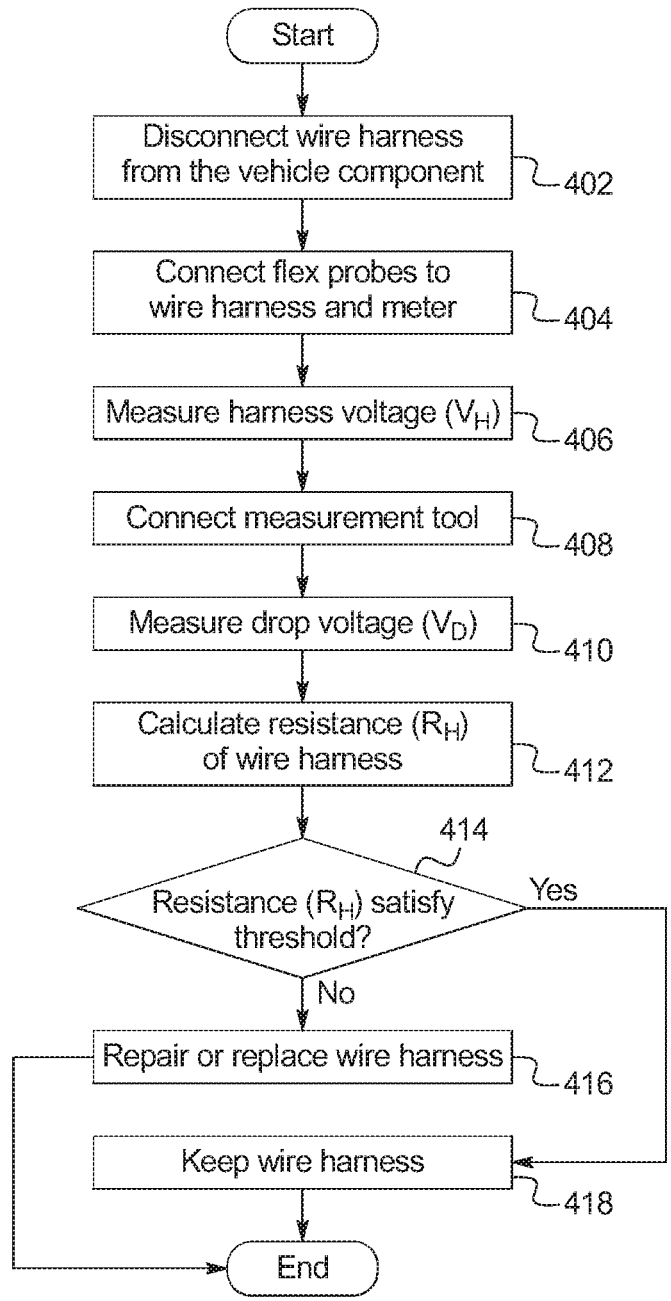
FIG. 4 is a flowchart of an example method to measure the resistance of the wire harness with the resistance measurement tool of FIGS. 2A, 2B and 3A, 3B.

FIG. 4 is a flowchart of an example method to measure the resistance of the wire harness with the resistance measurement tool of FIGS. 2A, 2B and 3A, 3B. The example method may be used to diagnose intermediate parts of the wire harness 102 to find high impedance portions of the wire harness 102 (such as, bad crimps, corroded terminals, broken wires, and/or overheating, etc.) Initially, the second connector 112 of the wire harness 102 is disconnected from the vehicle component 108 (block 402). The flex probes 118a and 118b are connected between the second connector 112 of the wire harness 102 and the meter 120 (block 404). In some examples, the flex probes 118a and 118b are connected to the pins of the second connector 112 corresponding to the power wire 114 and the ground wire 116 respectively. In some examples, the flex probe 118b is connected, via an alligator clip, to the frame of the vehicle 104. The flex probe 118b connected to the ground wire 116 (or the frame of the vehicle 104) is plugged into the ground jack of the meter 120. The flex probe 118a connected to the power wire 114 is plugged into the DC voltage measurement jack of the meter 120. The wire harness voltage ($V_H$) is measured on the meter 120 (block 406). The wire harness voltage ($V_H$) is the voltage of the battery without the resistance measurement tool 100. The resistance measurement tool 100 is then plugged into the meter 120 in parallel with wire harness 102 (as shown in FIG. 1) and/or is activated (via the push-button switch 300 of FIG. 3) (block 408). The drop voltage ($V_D$) is measured (block 410). The drop voltage ($V_D$) is the voltage measured when the resistance measurement tool 100 is connected/activated.

The resistance value ($R_H$) of the wire harness 102 is calculated in accordance with Equation (1) below (block 412).

$$R_H = \frac{(V_H - V_D) \times R_T}{V_D} \qquad \text{Equation (1)}$$

In Equation (1) above, $R_T$ is the impedance value of resistance measurement tool 100 (e.g. the resistor 202) of FIGS. 2A, 2B and 3A, 3B. For example, if the wire harness voltage ($V_H$) is 14.00V, the drop voltage ($V_D$) is 13.85V, and the impedance value ($R_T$) of the resistor 202 is 5Ω, the resistance value ($R_H$) of the wire harness 102 is 54 mΩ ((14.00–13.85)*5/13.85).

The resistance value ($R_H$) of the wire harness 102 is compared to an impedance threshold (T) (block 414). The impedance threshold (T) is a value corresponding to the wire harness 102 related to the voltage sensitivity ($V_S$) of the vehicle component 108. In some examples, the impedance threshold (T) is determined in accordance to Equation (2) below.

$$T = \frac{V_S}{I_N} \times P \qquad \text{Equation (2)}$$

In Equation (2) above, $I_N$ is the current normally used by the vehicle component 108 and P is a percentage (such as 60%). For example, if the vehicle component 108 has a voltage sensitivity ($V_S$) of 1V and the current ($I_N$) that flows through the wire harness 102 is 3A, the impedance threshold may be a percentage (P) of 333 mΩ. For example, the impedance threshold may be 200 mΩ (60% of 333 mΩ). The percentage (P) may be set to account for occasional voltage drops in the power system bus and/or to account for repairs to the wire harness. If the resistance value ($R_H$) of the wire harness 102 satisfies (e.g., is less than) the impedance threshold (T), the wire harness 102 is not replaced (block 416). Otherwise, if the resistance value ($R_H$) of the wire harness 102 does not satisfy (e.g., is greater than) the impedance threshold (T), the wire harness 102 is replaced (block 418). Alternatively, the wire harness 102 may be repaired. The method of FIG. 4 then ends.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or".

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A tool for measuring resistance of a wire harness comprising;
   a connector having first and second plugs;
   a resistor electrically coupled to the first plug; and
   a thermal switch electrically coupled between the resistor and the second plug, wherein a node between the resistor and the thermal switch is only shared by the resistor and the thermal switch.

2. The tool of claim 1, wherein the connector is a dual-pin banana plug.

3. The tool of claim 1, wherein the resistor is a power resistor.

4. The tool of claim 1, wherein the resistor has an impedance value between two to ten ohms.

5. The tool of claim 1, wherein the thermal switch is a normally-closed switch.

6. The tool of claim 1, wherein the thermal switch has a trigger threshold between 57 degrees Celsius and 63 degrees Celsius.

7. The tool of claim 6, wherein the thermal switch has a reset threshold 17 degrees below the trigger threshold.

8. The tool of claim 1, further including a heat shrink casing around the resistor and the thermal switch.

9. A resistance measurement tool comprising;
   a connector having first and second plugs;
   a resistor having a first terminal electrically coupled to the first plug, the resistor to generate heat when the resistance measurement tool is connected to a vehicle power bus;
   a first switch having a first terminal electrically coupled to a second terminal of the resistor;
   thermally conductive adhesive between the first switch and the resistor that attaches the first switch directly to the resistor; and
   a second switch attached to the resistor, a first terminal of the second switch electrically coupled to a second terminal of the first switch, a second terminal of the second switch electrically connected to the second plug, wherein a node between the resistor and the second switch is only shared by the resistor and the second switch.

10. The resistance measurement tool of claim 9, wherein the connector is a dual-pin banana plug.

11. The resistance measurement tool of claim 9, wherein the resistor is a power resistor.

12. The resistance measurement tool of claim 9, wherein the resistor has an impedance value between two to ten ohms.

13. The resistance measurement tool of claim 9, wherein the first switch is a push-button switch.

14. The resistance measurement tool of claim 9, wherein the second switch is a normally-closed thermal switch.

15. The resistance measurement tool of claim 14, wherein the second switch has a trigger threshold between 57 degrees Celsius and 63 degrees Celsius.

16. The resistance measurement tool of claim 15, wherein the thermal switch has reset threshold 17 degrees below the trigger threshold.

17. The resistance measurement tool of claim 9, further including a heat shrink casing around the resistor and the thermal switch.

18. The tool of claim 1, wherein the thermal switch is to switch open when a temperature of a surface of the resistor to which the thermal switch is directly attached to is greater than a trigger threshold temperature.

19. The tool of claim 1, wherein the resistor and the thermal switch are electrically coupled in series.

20. The tool of claim 1, wherein a node shared by the first plug and the resistor is only shared by the first plug and the resistor, and wherein a node shared by the second plug and the thermal switch is only shared by the second plug and the thermal switch.

21. The tool of claim 9, wherein the resistor, first switch, the second switch are electrically coupled in series.

22. The tool of claim 9, wherein a node between the first switch and the second switch is only shared by the first switch and the second switch.

* * * * *